United States Patent
Jang et al.

(10) Patent No.: US 9,058,895 B2
(45) Date of Patent: Jun. 16, 2015

(54) SELF-REFRESH CONTROL DEVICE AND METHOD FOR REDUCING A CURRENT REQUISITE FOR SELF-REFRESH OPERATION USING THE SAME

(71) Applicant: SK hynix Inc., Icheon-si Gyeonggi-do (KR)

(72) Inventors: Nam Kyu Jang, Icheon-si (KR); Young Geun Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 157 days.

(21) Appl. No.: 13/846,845

(22) Filed: Mar. 18, 2013

(65) Prior Publication Data

US 2014/0177360 A1    Jun. 26, 2014

(30) Foreign Application Priority Data

Dec. 21, 2012  (KR) .......................... 10-2012-0150995

(51) Int. Cl.
G11C 5/14       (2006.01)
G11C 11/40      (2006.01)
G11C 11/406     (2006.01)
G11C 11/4074    (2006.01)

(52) U.S. Cl.
CPC .......... *G11C 11/40615* (2013.01); *G11C 5/146* (2013.01); *G11C 11/406* (2013.01); *G11C 11/4074* (2013.01)

(58) Field of Classification Search
CPC ........ G11C 5/146; G11C 7/04; G11C 11/403; G11C 11/406; G11C 8/12; G11C 11/40615; G11C 2211/4065; G11C 2211/4067; G11C 11/40611

USPC ............ 365/63, 185.25, 189.06, 189.09, 222, 365/226, 227, 229
See application file for complete search history.

(56) References Cited

U.S. PATENT DOCUMENTS

| | | | |
|---|---|---|---|
| 5,315,557 A * | 5/1994 | Kim et al. ..................... | 365/222 |
| 6,137,743 A | 10/2000 | Kim | |
| 6,449,182 B1 * | 9/2002 | Ooishi ............................ | 365/63 |
| 2002/0191472 A1* | 12/2002 | Okamoto et al. ............. | 365/227 |
| 2007/0086258 A1* | 4/2007 | Freebern ....................... | 365/222 |
| 2007/0153611 A1* | 7/2007 | Lee ................................ | 365/226 |
| 2007/0183247 A1* | 8/2007 | Horiguchi et al. ............ | 365/226 |
| 2008/0101134 A1* | 5/2008 | Chu ........................ | 365/189.09 |
| 2012/0163111 A1* | 6/2012 | Shim ............................ | 365/222 |

FOREIGN PATENT DOCUMENTS

| | | |
|---|---|---|
| KR | 1020070081030 A | 8/2007 |
| KR | 1020110047892 A | 5/2011 |

* cited by examiner

*Primary Examiner* — Richard Elms
*Assistant Examiner* — Ajay Ojha
(74) *Attorney, Agent, or Firm* — William Park & Associates Ltd.

(57) ABSTRACT

Provided is a device and method for controlling self-refresh which reduces current when a semiconductor device stays in a self-refresh operation. The device for controlling self-refresh includes a bulk voltage controller configured to combine an idle signal indicating an active termination state of a bank and a self-refresh signal so as to generate a control signal for controlling a bulk voltage, a bulk voltage driver configured to vary a level of the bulk voltage in response to the control signal, and output the bulk voltage with a different level, and a refresh controller configured to output the self-refresh active signal upon receiving the bulk voltage as a bulk bias voltage.

16 Claims, 6 Drawing Sheets

SELF-REFRESH CONTROL DEVICE AND METHOD FOR REDUCING A CURRENT REQUISITE FOR SELF-REFRESH OPERATION USING THE SAME

CROSS-REFERENCE TO RELATED APPLICATION

The present application claims priority under 35 U.S.C 119(a) to Korean Patent Application No. 10-2012-0150995 filed on Dec. 21, 2012 in the Korean Intellectual Property Office, which is incorporated herein by reference in its entirety.

BACKGROUND

Embodiments of the present invention generally relate to a device and method for controlling self-refresh, and more particularly to a technology for reducing a current when a semiconductor device is in a self-refresh operation.

Generally, in a memory unit of a dynamic random access memory (DRAM), a plurality of unit cells each of which contains one transistor and one capacitor, is configured in the form of a matrix in a manner where the unit cells are arranged in a plurality of rows and columns. Addresses designate such rows and columns, and commands for performing the read/write operation in each cell unit are provided to such addresses.

A DRAM cell stores charge-type data in a cell, but due to material limitations of silicon requisite for cell fabrication, the data needs to be periodically recharged to prevent data loss.

Data stored in a DRAM cell is recharged by eliminating leakage current, sensing and amplifying the data of the cell, and rewriting the sensed and amplified data back into the cell. This recharge operation is referred to as a refresh operation.

Effectively, the refresh operation reads data from the DRAM cell, amplifies the read data, and re-stores the amplified data. The refresh operation is performed by a bit line sense amplifier (sense-amp) located close to a memory cell array.

The refresh operation begins when a refresh command is received, after which one of a plurality of rows contained in a unit cell array is selected on the basis of a row address activated by the refresh command.

As a corresponding word line of the selected row is charged with a constant potential, all cells connected to the selected row are activated, and data is transmitted to a bit line through an activated cell. Data is amplified due to the operation of the bit line sense-amplifier, and is subsequently stored in the selected cell.

The most representative refresh methods for synchronous DRAMs are classified into an auto-refresh method and a self-refresh method. In an auto-refresh method, an auto-refresh operation is performed through an external terminal of a synchronous DRAM chip at a predetermined time.

However, in a self-refresh method, when a command is provided, a subsequent refresh operation is automatically carried out in response to an indication message from a timer embedded in a chip.

A method for entering the self-refresh mode in the synchronous DRAM is synchronized with a clock signal. That is, an entry mode is determined by external signals such as a RAS bar signal (RAS#), a CAS bar signal (CAS#), a column selection signal (CS#), a clock enable signal (CKE), etc. at a positive edge of the clock signal.

However, there is a need for a condition capable of terminating a self-refresh operation either after the refresh operation is executed on the basis of a constant internal period during the self-refresh operation, or at any time during the refresh operation. That is, during the self-refresh operation, internal operations of the chip are asynchronously operated and are not affected by external clocks.

Particularly, the self-refresh termination operation is achieved by deactivation of a pin of a clock enable signal (CKE). Therefore, the self-refresh termination operation is asynchronously achieved.

A method for terminating the self-refresh operation is also achieved by reactivation of a clock enable signal. That is, as the clock enable signal is activated, the external clock signal is re-applied to the chip, and the chip operation is re-affected by the external clock signal. After completion of the self-refresh operation, a predetermined delay time elapses, and subsequently another operation starts.

The operation intervals of the self-refresh mode can be classified into a first operation interval, a second operation interval, and a third operation interval. According to the first operation interval, the synchronous DRAM is synchronized with the clock signal to enter the self-refresh mode. According to the second operation interval, the internal refresh operation of the synchronous DRAM is asynchronously performed. According to the third operation interval, the synchronous DRAM is asynchronously terminated.

Since how long a mobile product can function with an embedded battery is an important factor in the product, it is very important for a mobile DRAM mounted to such products to reduce a self-refresh current generated in a DRAM standby state.

SUMMARY

Various embodiments of the present invention are directed to providing a self-refresh control device that substantially obviates one or more problems due to limitations and disadvantages of the related art.

An embodiment of the present invention relates to a method for reducing a current requisite for a self-refresh operation using a bulk-bias control scheme, and stably performing the self-refresh operation by controlling a signal indicating termination of a self-refresh active operation.

In accordance with an embodiment of the present invention, a self-refresh control device includes: a bulk voltage controller configured to combine an idle signal indicating an active termination state of a bank and a self-refresh signal so as to generate a control signal for controlling a bulk voltage; a bulk voltage driver configured to vary a level of the bulk voltage in response to the control signal, and output the bulk voltage with a different level; and a refresh controller configured to output the a self-refresh active signal upon receiving the bulk voltage as a bulk bias voltage.

In accordance with another embodiment of the present invention, a method for controlling self-refresh, comprising the steps of: generating an idle signal by combining bank addresses; combining the idle signal indicating an active termination state of a bank and a self-refresh signal so as to generate a control signal for controlling a bulk voltage; varying a level of the bulk voltage in response to the control signal, and outputting the bulk voltage with a different level; and outputting a self-refresh active signal upon receiving the bulk voltage as a bulk bias voltage.

In accordance with another embodiment of the present invention, a method for controlling self-refresh, comprising the steps of: using a bulk-bias control scheme; and stably performing the self-refresh operation by controlling a signal indicating termination of a self-refresh active operation.

It is to be understood that both the foregoing general description and the following detailed description of the present invention are explanatory and are intended to provide further explanation of the invention as claimed.

DETAILED DESCRIPTION

Reference will now be made in detail to various embodiments of the present invention, examples of which are illustrated in the accompanying drawings. Wherever possible, the same reference numbers will be used throughout the drawings to refer to the same or like parts.

Figure 1:
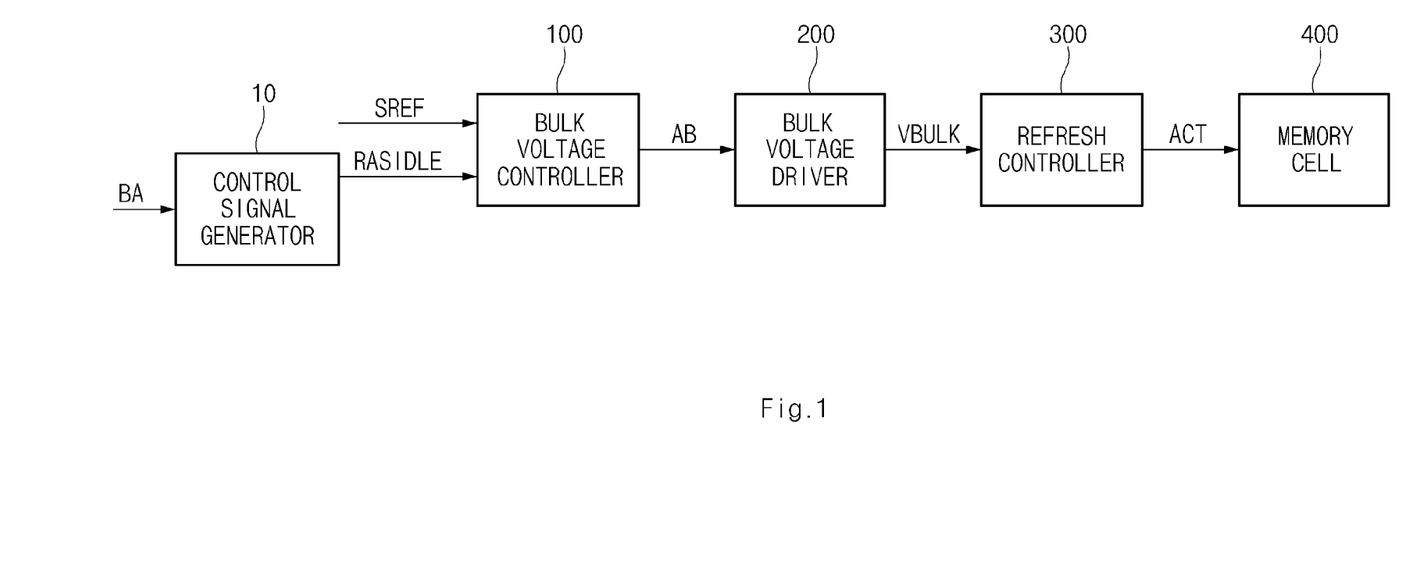
FIG. 1 is a block diagram illustrating a self-refresh control device according to an embodiment of the present invention.

Referring to FIG. 1, the self-refresh control device may include a control signal generator 10, a bulk voltage controller 100, a bulk voltage driver 200, a refresh controller 300, and a memory cell 400.

The control signal generator 10 may combine a plurality of bank addresses BA, such as BA<0>-BA<7> (not illustrated), to generate an idle signal RASIDLE. The idle signal RASIDLE may transition to a low level when none of the bank addresses from among a plurality of bank addresses (BA<0>-BA<7>) is in an active state.

The idle signal RASIDLE may be maintained at a high level when at least one bank address from among a plurality of bank addresses (BA<0>-BA<7>) is in an active state. That is, at least one bank from among a plurality of bank addresses (BA<0>-BA<7>) is activated in a specific interval in which the idle signal RASIDLE is activated to a high level. If the idle signal RASIDLE transitions to a low level, this may indicate that the active operation of all banks has been terminated.

The bulk voltage controller 100 may output a control signal AB in response to a self-refresh signal SREF and an idle signal RASIDLE. The bulk voltage driver 200 may drive and output the bulk voltage VBULK in response to the control signal AB for the self-refresh active operation.

The bulk voltage controller 100 may be configured to output the control signal AB having a high level when the idle signal RASIDLE is activated in the self refresh operation, that is, the self refresh signal SREF has a high level. Therefore, the bulk voltage driver 200 may not vary the level of the bulk voltage VBULK.

On the other hand, if the active operation of all banks is terminated during the self-refresh active operation such that the idle signal RASIDLE is deactivated, the control signal AB is transitioned to a low level and subsequently outputted. Therefore, the bulk voltage driver 200 may be controlled to increase the level of the bulk voltage VBULK.

The refresh controller 300 may receive the bulk voltage VBULK as a bulk bias voltage, and output an active signal ACT to the memory cell 400. If the active signal ACT is activated, a word line of each memory cell 40 may be enabled such that the self-refresh operation of each bank is carried out.

Figure 2:
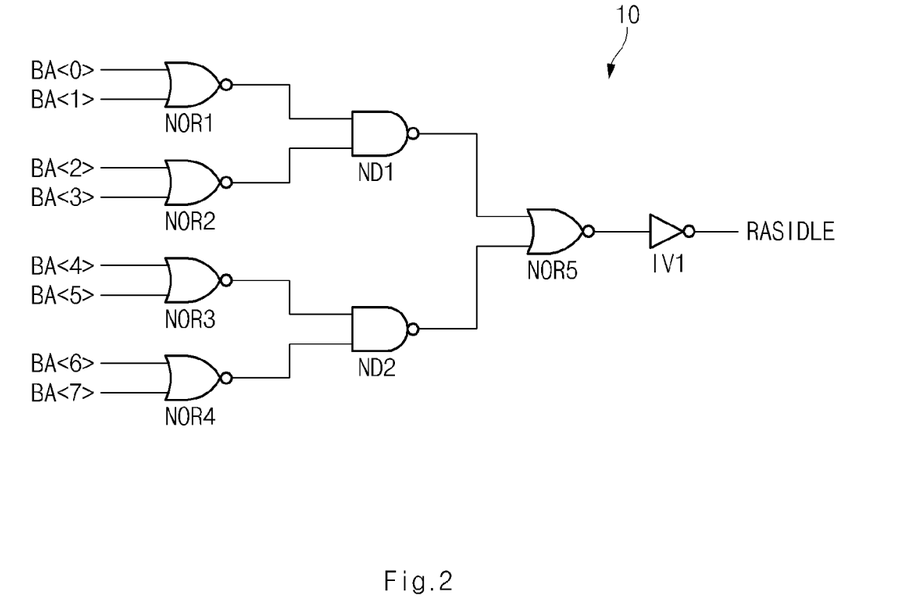
FIG. 2 is a detailed circuit diagram illustrating a control signal generator of FIG. 1.

Referring to FIG. 2, the control signal generator 10 may include a plurality of NOR gates (NOR1-NOR5), a plurality of NAND gates (ND1, ND2), and an inverter IV1.

The NOR gate NOR1 may perform a NOR operation on bank addresses BA<0> and BA<1>, and output the NOR operation result. The NOR gate NOR2 may perform a NOR operation on bank addresses BA<2> and BA<3>, and output the NOR operation result. The NOR gate NOR3 may perform a NOR operation on bank addresses BA<4> and BA<5>, and output the NOR operation result. The NOR gate NOR4 may perform a NOR operation on bank addresses BA<6> and BA<7>, and output the NOR operation result.

The NAND gate ND1 may perform a NAND operation on output signals of the NOR gates NOR1 and NOR2. The NAND gate ND2 may perform a NAND operation on output signals of the NOR gates NOR3 and NOR4. The NOR gate NOR5 may perform a NOR operation on output signals of the NAND gates ND1 and ND2. The inverter IV2 may invert the output signal of the NOR gate NOR5 so as to output an idle signal RASIDLE.

If at least one bank address from among bank addresses BA<0>-BA<7> is in an active state, the control signal generator 10 may output a high-level idle signal RASIDLE. If all bank addresses BA<0>-BA<7> are at a low level after completion of the active operation, the control signal generator 10 may transition the idle signal RASIDLE to a low level.

Figure 3:
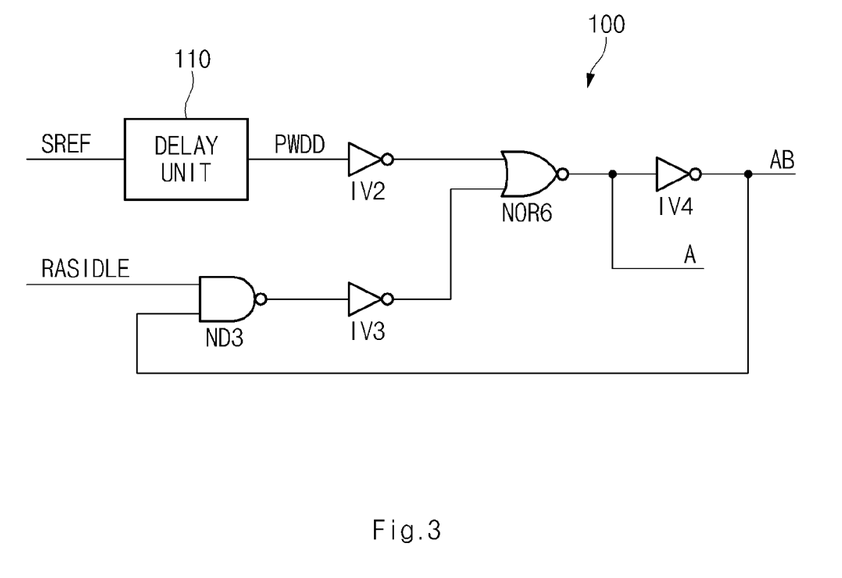
FIG. 3 is a detailed circuit diagram illustrating a bulk voltage controller of FIG. 1.

Referring to FIG. 3, the bulk voltage controller 100 may include a delay unit 110, a NAND gate ND3, a NOR gate NOR6, and a plurality of inverters IV2-IV4. The NAND gate ND3, the NOR gate NOR6, and a plurality of inverters IV2-IV4 may correspond to logic operation units.

The delay unit 110 may delay the self-refresh signal SREF for a predetermined period of time and output a delay signal PWDD. The NAND gate ND3 may perform a NAND operation on the idle signal RASIDLE and the control signal AB. The inverter IV3 may invert the output signal of the NAND gate ND3.

The NOR gate NOR6 may perform a NOR operation on the delay signal PWDD inverted by the inverter IV2 and the output signal of the inverter IV3, such that it outputs a control signal A. The inverter IV4 may invert the control signal A such that it outputs the control signal AB.

Figure 4:
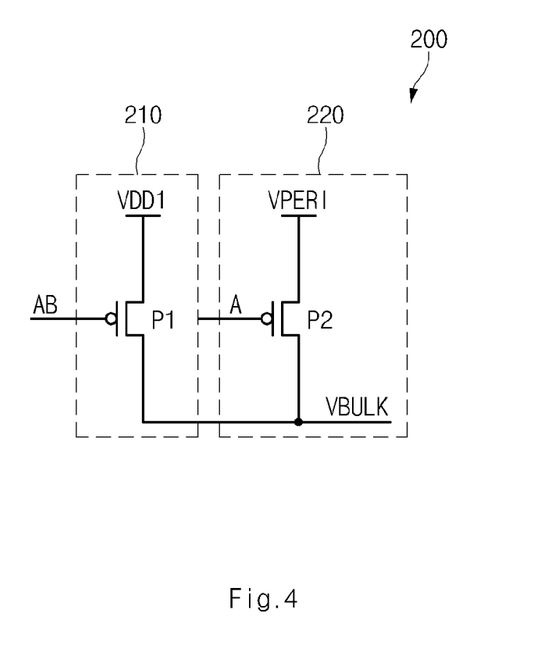
FIG. 4 is a detailed circuit diagram illustrating a bulk voltage driver of FIG. 1.

Referring to FIG. 4, the bulk voltage driver 200 may include a first voltage supply unit 210 and a second voltage supply unit 220. The first voltage supply unit 210 may provide a power-supply voltage VDD1 as a bulk voltage VBULK, and the second voltage supply unit 220 may provide a peri-voltage VPERI as a bulk voltage VBULK. The peri-voltage VPERI may be lower than the power-supply voltage VDD1 and indicate an external input voltage.

The first voltage supply unit 210 may include a PMOS transistor P1 disposed between the power-supply voltage VDD1 input terminal and the bulk voltage (VBULK) output terminal, such that it receives the control signal AB through a gate terminal.

The second voltage supply unit 220 may include a PMOS transistor P2 disposed between the peri-voltage VPERI input terminal and the bulk voltage (VBULK) output terminal, such that it receives the control signal A through a gate terminal.

Figure 5:
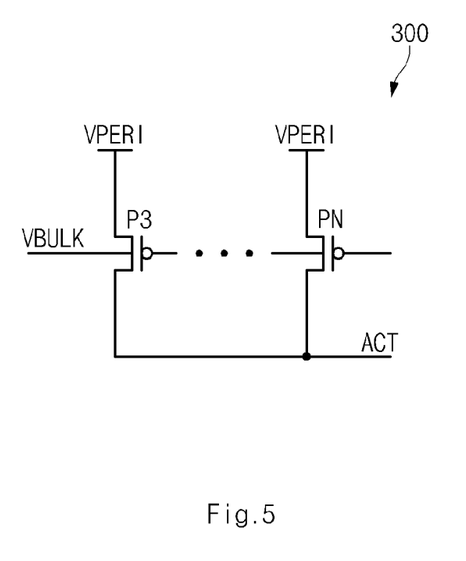
FIG. 5 is a detailed circuit diagram illustrating a refresh controller of FIG. 1.

Referring to FIG. 5, the refresh controller 300 may include a plurality of voltage drivers, such as a plurality of PMOS transistors P3-PN. The PMOS transistors P3-PN may be coupled in parallel between a peri-voltage VPERI input terminal and an active signal ACT output terminal, such that the bulk voltage VBULK may be applied to the PMOS transistors P3-PN through the bulk terminal. For example, the PMOS transistor may receive gates voltages having a high level to be turned on in the active mode, and may receive the gates voltages having a low level to be turned off in the self refresh mode.

The self-refresh control device according to an embodiment of the present invention may be configured to use a PMOS bulk bias control scheme of the PMOS transistors P3-PN so as to reduce the self-refresh current. The self-refresh control device can reduce an off-leakage current of the PMOS transistors P3-PN using the bulk bias control scheme.

The sub-threshold leakage current occurs in an off-state transistor. The off-leakage current may be inversely proportional to a threshold voltage Vt (not shown) of the transistor, and may be proportional to a drain-source voltage Vds (not shown).

Therefore, in order to reduce the off leakage current during the self-refresh active operation, bulk voltage levels of the PMOS transistors P3-PN may be increased. In the self-refresh active operation mode, the first voltage supply unit 210 may be turned on such that the bulk voltage VBULK is increased to the power-supply voltage VDD1. In the normal mode, the second voltage supply unit 220 may be turned on such that the bulk voltage VBULK is reduced to the peri-voltage VPERI.

The bulk bias control scheme using the self-refresh interval aims to reduce an off leakage current using transistor characteristics. The bulk bias control scheme applies a higher voltage than a source voltage to the bulk bias of the transistor, such that it can control the leakage current that flows from a source terminal to a drain terminal.

Figure 6:
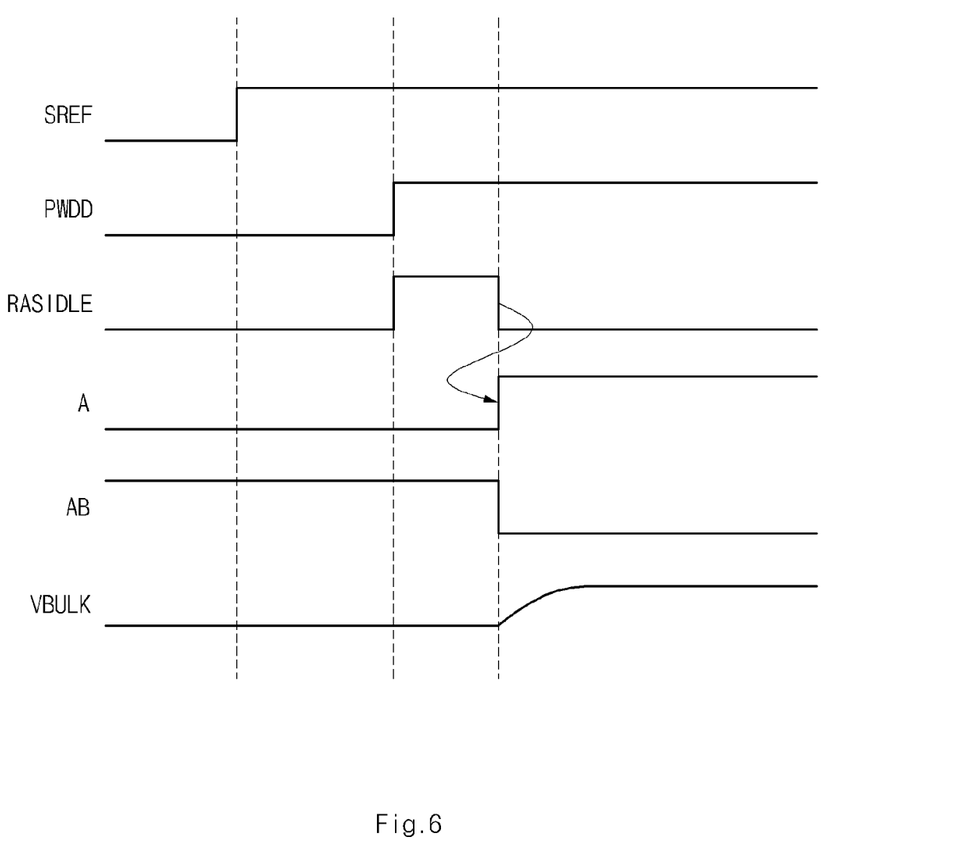
FIG. 6 is a timing diagram illustrating a self-refresh control device according to an embodiment of the present invention.

However, the refresh operation may frequently be carried out. Accordingly, in order to reduce power consumption between the refresh entry and the refresh exit, the bulk voltage may be kept consistent for a predetermined period of time after the self-refresh operation begins. Referring to FIG. 6, the self-refresh signal SREF may be activated such that the self-refresh mode starts operation. Then, after a lapse of delay time of the delay unit 110, the delay signal PWDD may transition to a high level.

In the conventional art, after a lapse of a predetermined delay time after entering the self-refresh mode, the bulk voltage VBULK increases. However, when entering the self-refresh mode, a control signal for executing the self-refresh operation is generated such that the self-refresh active operation is performed per bank.

That is, when the bulk voltage VBULK of a transistor increases in response to an input bulk bias, the active signal ACT may be activated. If the active operation is performed under the condition that the bulk voltage VBULK varies, a gate terminal of the transistor for the self-refresh operation may transition to a high or low level.

As a result, the bulk voltage VBULK may become unstable such that it is impossible to stably perform the self-refresh operation. Therefore, the self-refresh operation for each cell may be incorrectly performed, resulting in the occurrence of data loss.

An embodiment of the present invention controls the bulk voltage VBULK to not change when the bank is activated during the self-refresh operation. That is, an embodiment of the present invention controls a signal indicating a termination of the self-refresh active operation to stabilize the self-refresh operation.

Upon receiving the self-refresh command, the self-refresh signal SREF may be activated. If the self-refresh operation begins by activation of the self-refresh signal SREF, the delay signal PWDD may transition to a high level after a lapse of delay time of the delay unit 110. In order to prevent power consumption caused by frequent execution of the self-refresh operation, the self-refresh signal SREF activated by the self-refresh entry may be delayed for a predetermined time, resulting in formation of the delay signal PWDD.

Provided that the delay signal PWDD and the idle signal RASIDLE are at a high level, the control signal A may be maintained at a low level without change. If the control signal A is at a low level, the PMOS transistor P2 is turned on and the PMOS transistor P1 is turned off in FIG. 4.

Accordingly, the bulk voltage VBULK is output at a peri-voltage VPERI level, where the peri-voltage VPERI is applied to bulk terminals of the PMOS transistors P3-PN. Therefore, the same voltage may be applied to a source terminal and a bulk terminal of each of the PMOS transistors P3-PN.

The delay signal PWDD may be at a high level during a rising time of the bulk voltage VBULK. If the idle signal RASIDLE indicating an active operation state of the bank transitions to a high level on the condition that the delay signal PWDD is at a high level, the bulk voltage VBULK may not increase and remain unchanged, as shown in FIG. 6.

Thereafter, the control signal generator 10 may allow the idle signal RASIDLE to be transitioned to a low level when all bank addresses BA<0>-BA<7> are at a low level due to termination of the active operation. If the idle signal RASIDLE transitions to a low level on the condition that the delay signal PWDD is at a high level, this may indicate that the active operation of all banks is terminated. Therefore, when the idle signal RASIDLE transitions to a low level, the control signal A may transition to a high level and the control signal AB may transition to a low level.

Thus, the PMOS transistor P2 may be turned off and the PMOS transistor P1 may be turned on. Therefore, the bulk voltage VBULK may be output as a power-supply voltage level VDD1, such that a power-supply voltage VDD1 is applied to bulk terminals of the PMOS transistors P3-PN.

A source voltage of each of the PMOS transistors P3-PN is a peri-voltage VPERI. Therefore, the power-supply voltage VDD1 higher than that of a source terminal may be applied to the bulk terminal of each of the PMOS transistors P3-PN, such that an off leakage current flowing from a source terminal to a drain terminal of each of the PMOS transistors P3-PN can be greatly reduced.

Assuming that the control signal AB is at a low level, the bulk voltage VBULK can maintain its value even when the idle signal RASIDLE transitions to a high level in a subsequent process. In other words, assuming that the bulk voltage VBULK increases and the subsequent idle signal RASIDLE transitions to a high level, the active operation may be carried out.

The active operation state in which the bulk voltage VBULK increases may indicate that the bulk voltage VBULK has already been stabilized to the power-supply voltage level VDD1. Therefore, assuming that the control signal AB is at a low level and the subsequent idle signal RASIDLE transitions to a high level, the bulk voltage level VBULK may remain unchanged unless changed by the self-refresh signal SREF.

As is apparent from the above description, the various embodiments of the present invention can remove unstable elements of the self-refresh active region, and can stably perform the self-refresh operation.

Those skilled in the art will appreciate that the present invention may be carried out in other specific ways than those set forth herein without departing from the spirit and essential characteristics of the present invention. The above various embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A device for controlling self-refresh comprising:
   a bulk voltage controller configured to combine an idle signal indicating an active termination state of a bank and a self-refresh signal so as to generate a control signal and an inverted control signal for controlling a bulk voltage;
   a bulk voltage driver configured to vary a level of the bulk voltage in response to the control signal and the inverted control signal, and output the bulk voltage with a different level; and
   a refresh controller configured to output a self-refresh active signal upon receiving the bulk voltage as a bulk bias voltage,
   wherein the bulk voltage controller includes:
   a delay unit configured to output a delay signal by delaying the self-refresh signal; and
   a logic operation unit configured to output the control signal and the inverted control signal by performing a logic operation on the delay signal and the idle signal.

2. The device for controlling self-refresh according to claim 1, further comprising:
   a control signal generator configured to generate the idle signal by combining bank addresses.

3. The device for controlling self-refresh according to claim 2, wherein the control signal generator combines the bank addresses such that the idle signal transitions depending on completion of active operations within the banks.

4. The device for controlling self-refresh according to claim 3, wherein the control signal generator combines the bank addresses such that the idle signal transitions to a low level upon completion of active operations of all banks.

5. The device for controlling self-refresh according to claim 1, wherein if the idle signal is activated in a self-refresh active mode on the condition that the self-refresh signal is at a high level, the bulk voltage level remains unchanged.

6. The device for controlling self-refresh according to claim 1, wherein:
   under the condition that the delay signal is activated to a high level in response to the self-refresh signal,
   if the idle signal is activated, the bulk voltage controller does not change the control signal; and
   if the idle signal is deactivated, the bulk voltage controller performs a transition of the control signal.

7. The device for controlling self-refresh according to claim 1, wherein:
   if the control signal is activated, the bulk voltage driver outputs a first voltage level as a level of the bulk voltage, and
   if the control signal is deactivated, the bulk voltage driver outputs a second voltage level lower than the first voltage level as the bulk voltage level.

8. The device for controlling self-refresh according to claim 7, wherein the first voltage is a power-supply voltage.

9. The device for controlling self-refresh according to claim 7, wherein the second voltage is a peri-voltage.

10. The device for controlling self-refresh according to claim 1, wherein the bulk voltage driver includes:
    a first voltage supply unit configured to output a first voltage as the bulk voltage when the control signal is activated; and
    a second voltage supply unit configured to output a second voltage lower than the first voltage as the bulk voltage when the control signal is deactivated.

11. The device for controlling self-refresh according to claim 10, wherein the first voltage is a power-supply voltage.

12. The device for controlling self-refresh according to claim 10, wherein the second voltage is a peri-voltage.

13. The device for controlling self-refresh according to claim 1, wherein the refresh controller includes a voltage driver that is disposed between a peri-voltage input terminal and an output terminal of the self-refresh active signal so as to receive the bulk voltage through a bulk terminal.

14. A method for controlling self-refresh, comprising the steps of:
    generating an idle signal by combining bank addresses;
    a delay unit configured to output a delay signal by delaying a self-refresh signal;
    combining the idle signal indicating an active termination state of a bank and the self-refresh signal so as to generate a control signal and an inverted control signal for controlling a bulk voltage; varying a level of the bulk voltage in response to the control signal and the inverted control signal, and outputting the bulk voltage with a different level; and
    outputting a self-refresh active signal upon receiving the bulk voltage as a bulk bias voltage.

15. The method according to claim 14, wherein
    if the control signal is activated, the bulk voltage outputted has a first voltage level, and
    if the control signal is deactivated, the bulk voltage outputted has a second voltage lower than the first voltage level.

16. The method according to claim 15, wherein the first voltage is a power-supply voltage and the second voltage is a peri-voltage.

* * * * *